(12) United States Patent
Huh et al.

(10) Patent No.: US 7,709,838 B2
(45) Date of Patent: May 4, 2010

(54) THIN FILM TRANSISTOR ARRAY PANEL

(75) Inventors: Jong-Moo Huh, Hwasung-si (KR);
Seung-Kyu Park, Hwasung-si (KR);
Nam-Deog Kim, Yongin-si (KR);
Joon-Hoo Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 366 days.

(21) Appl. No.: 11/550,187

(22) Filed: Oct. 17, 2006

(65) Prior Publication Data
US 2007/0105286 A1 May 10, 2007

(30) Foreign Application Priority Data
Oct. 17, 2005 (KR) .................. 10-2005-0097427

(51) Int. Cl.
*H01L 31/00* (2006.01)
(52) U.S. Cl. .................. 257/57; 257/E29.151; 345/93; 438/149
(58) Field of Classification Search ........... 257/79–103, 257/57–60, E51.005, E29.151; 438/149–167; 345/93
See application file for complete search history.

(56) References Cited

U.S. PATENT DOCUMENTS

| 5,668,381 | A | * | 9/1997 | Bae | ........................... | 257/72 |
| 6,890,803 | B2 | | 5/2005 | Lin et al. | | |
| 7,136,116 | B2 | * | 11/2006 | Sakamoto et al. | ............ | 349/43 |
| 7,301,168 | B2 | * | 11/2007 | Rhee et al. | ..................... | 257/40 |
| 2005/0275614 | A1 | * | 12/2005 | Kim et al. | .................... | 345/100 |

FOREIGN PATENT DOCUMENTS

| JP | 05-063196 | 3/1993 |
| JP | 09-172186 | 6/1997 |
| JP | 2000-352941 | 12/2000 |
| JP | 2004-327872 | 11/2004 |
| KR | 1993-008498 | 5/1993 |
| KR | 2004-0059701 | 7/2004 |
| KR | 1020050009179 | 1/2005 |
| KR | 1020050069314 | 7/2005 |

OTHER PUBLICATIONS

Peter Van Zant, Microchip Fabrication, 2000, McGraw-Hill, p. 386.*

* cited by examiner

*Primary Examiner*—Brook Kebede
(74) *Attorney, Agent, or Firm*—Cantor Colburn LLP

(57) ABSTRACT

The present invention relates to an OLED display and a manufacturing method thereof, including a substrate, a control electrode formed on the substrate, a polysilicon semiconductor formed on the control electrode, a data line including an input electrode at least partially overlapping the polysilicon semiconductor and an output electrode facing the input electrode, an insulating layer covering the data line and the output electrode and having a contact hole, a gate line connected to the control electrode through the contact hole, and a pixel electrode connected to the output electrode.

10 Claims, 17 Drawing Sheets

【FIG. 1】
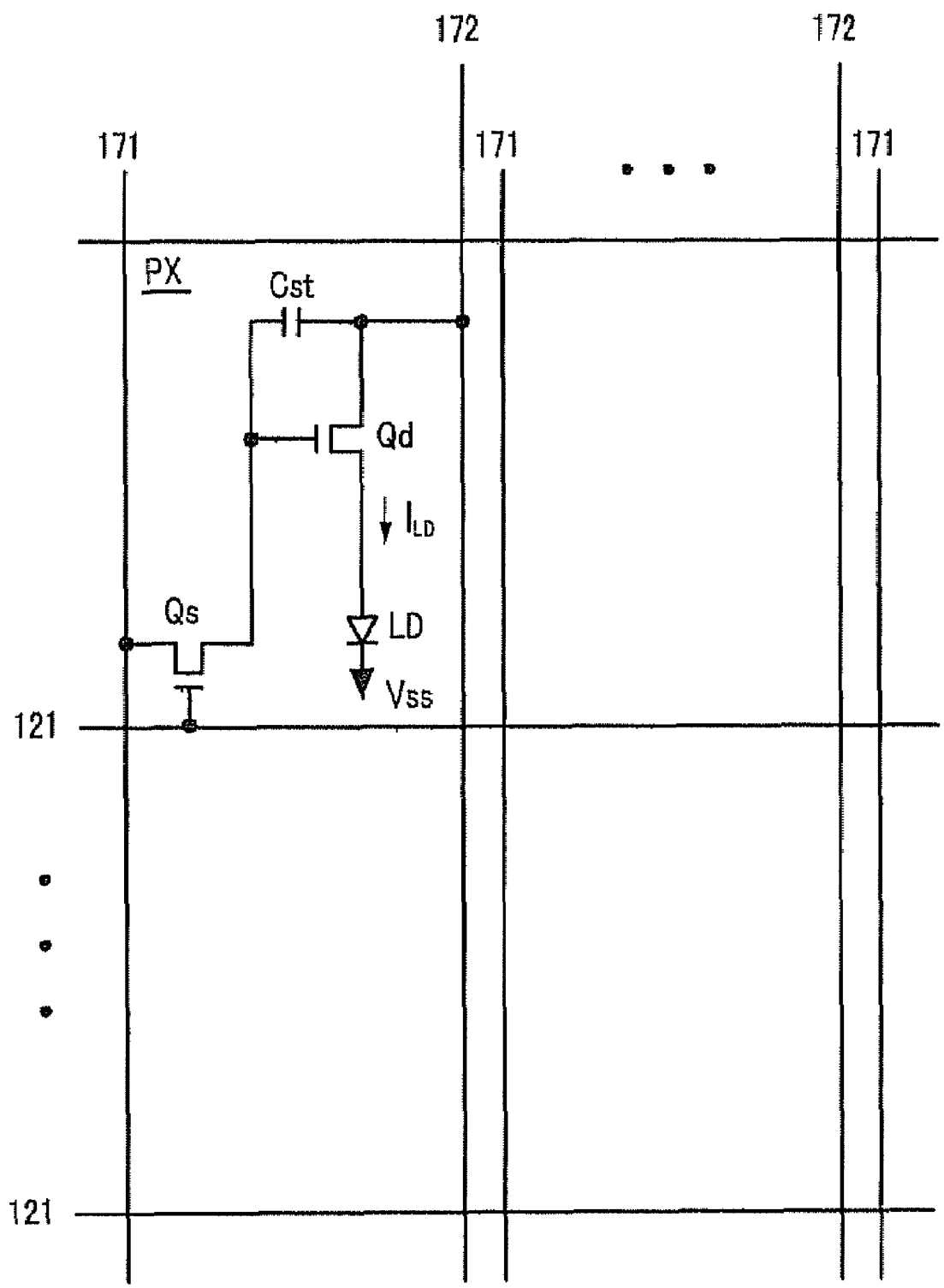

[FIG. 2]
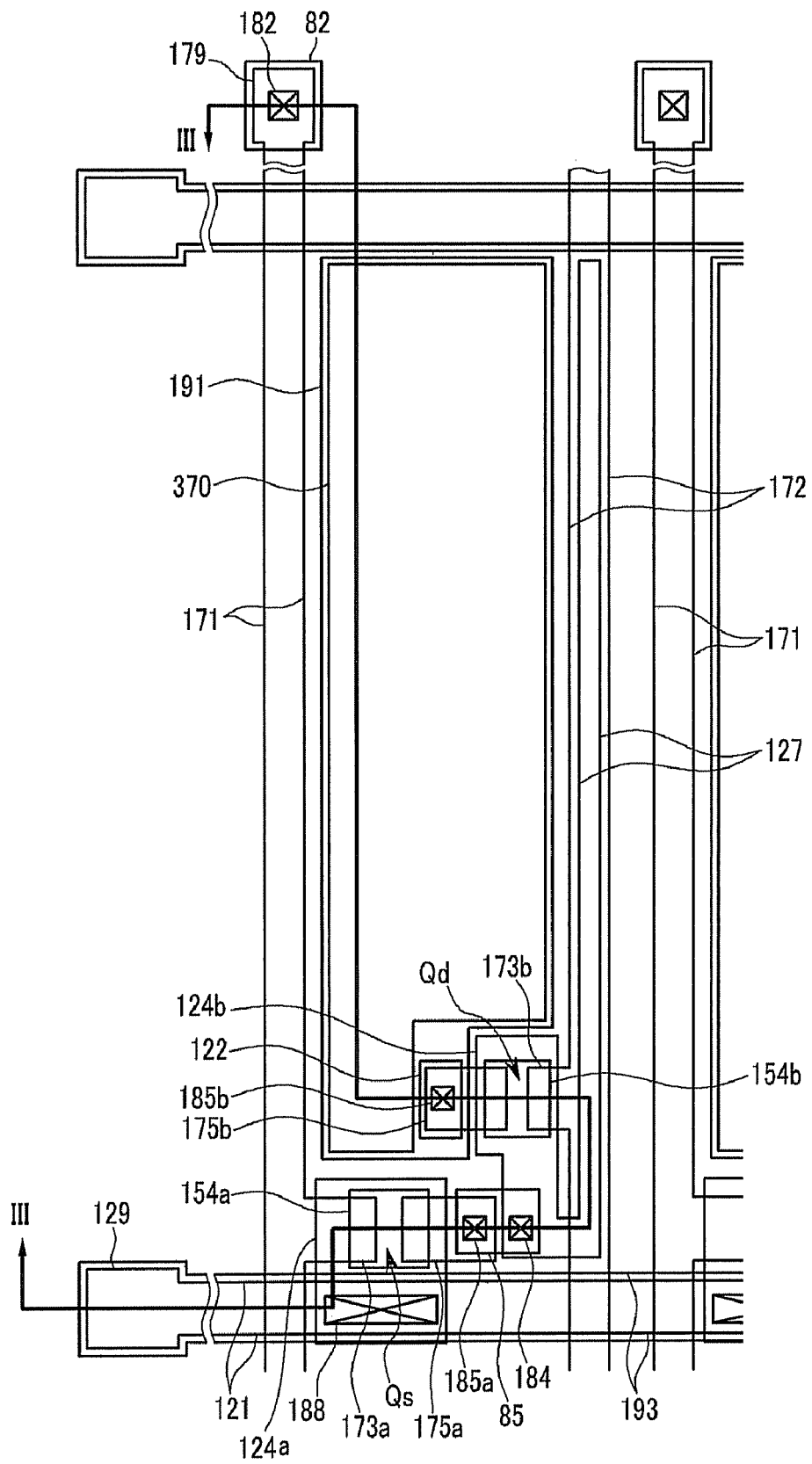

[FIG. 3]
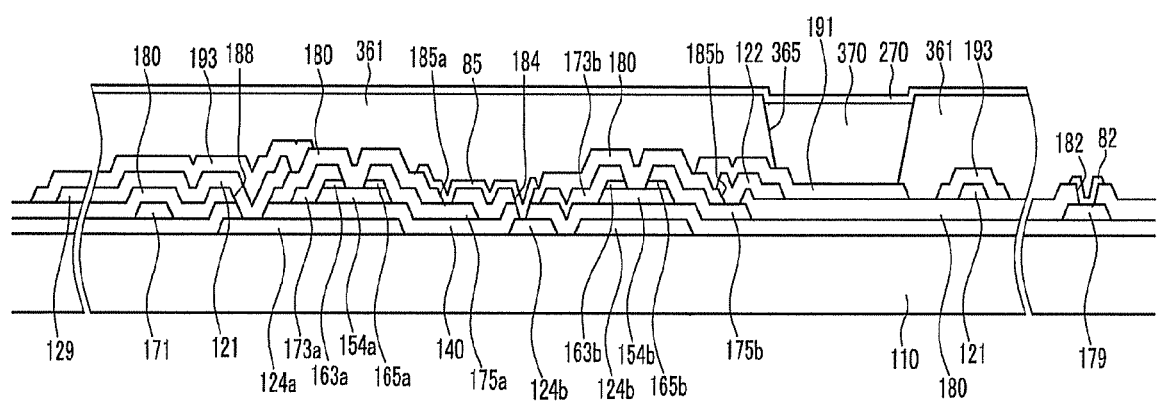

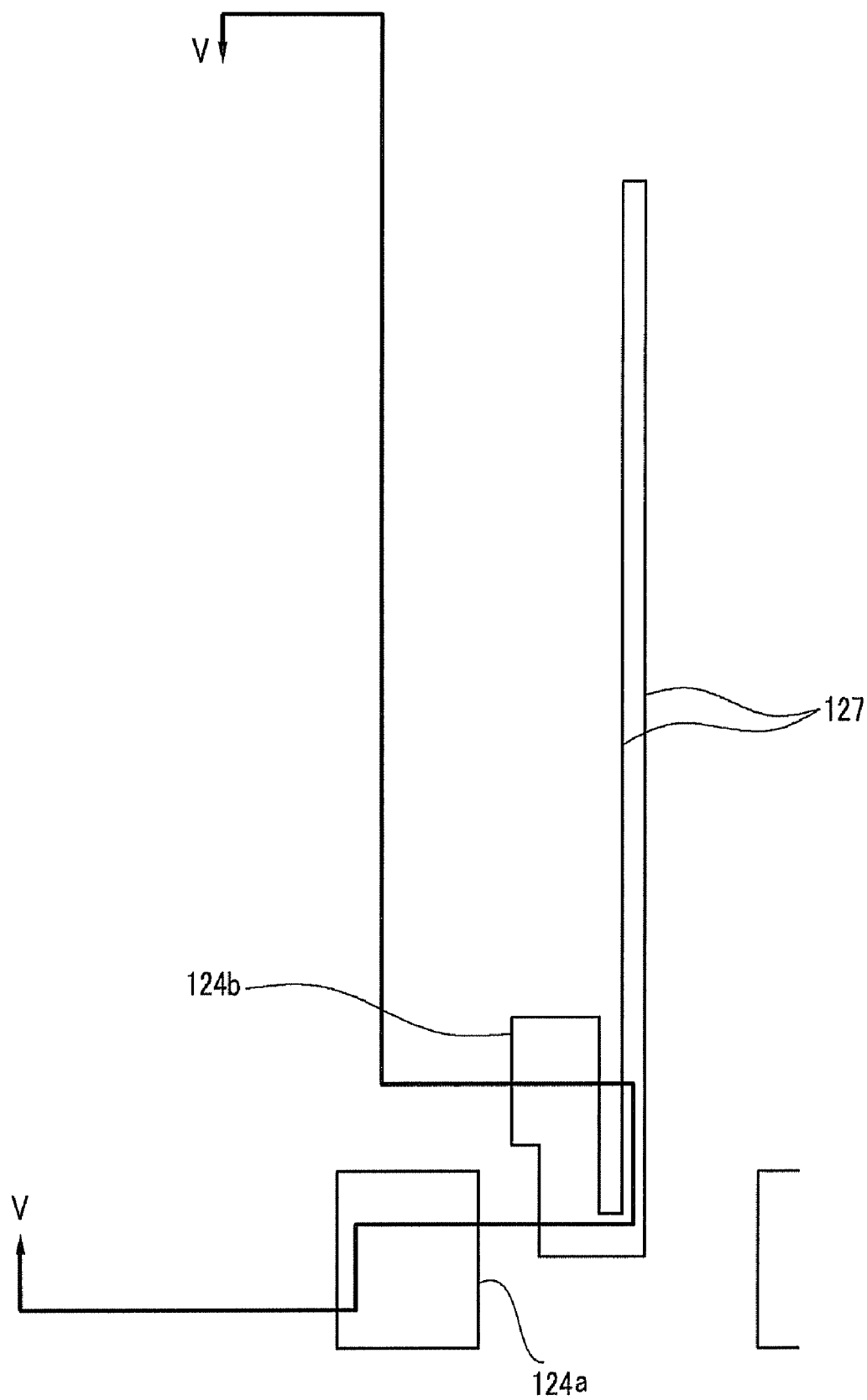
[FIG. 4]

[FIG. 5]
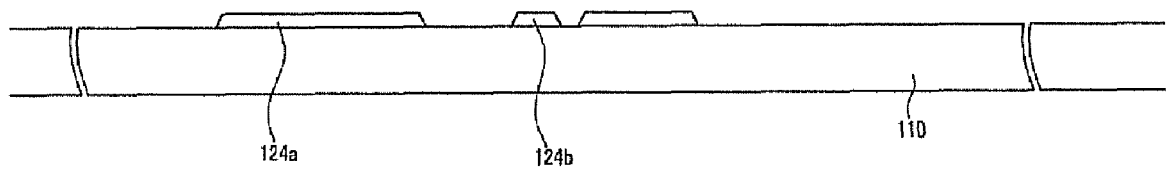

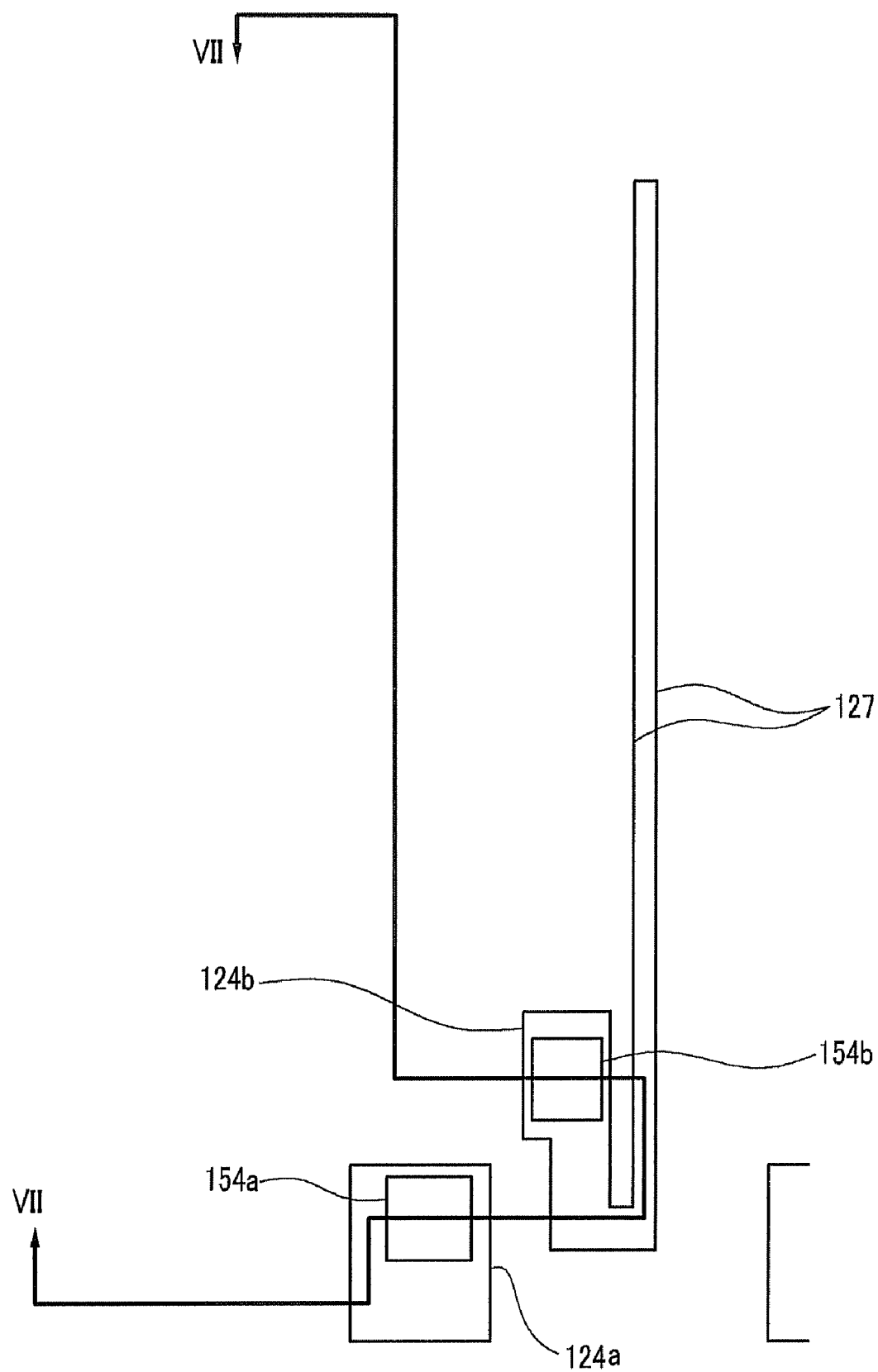

[FIG. 7]
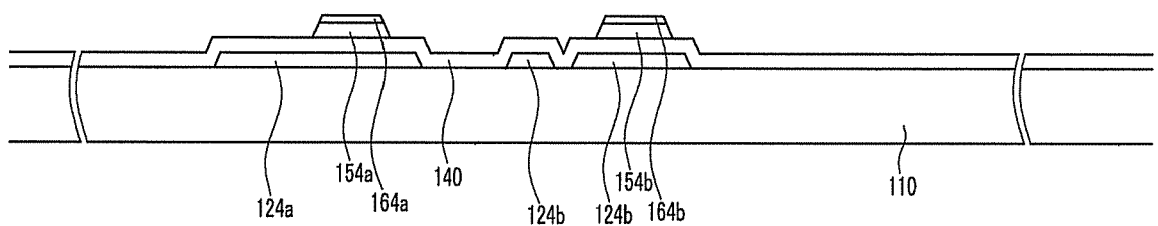

[FIG. 8]
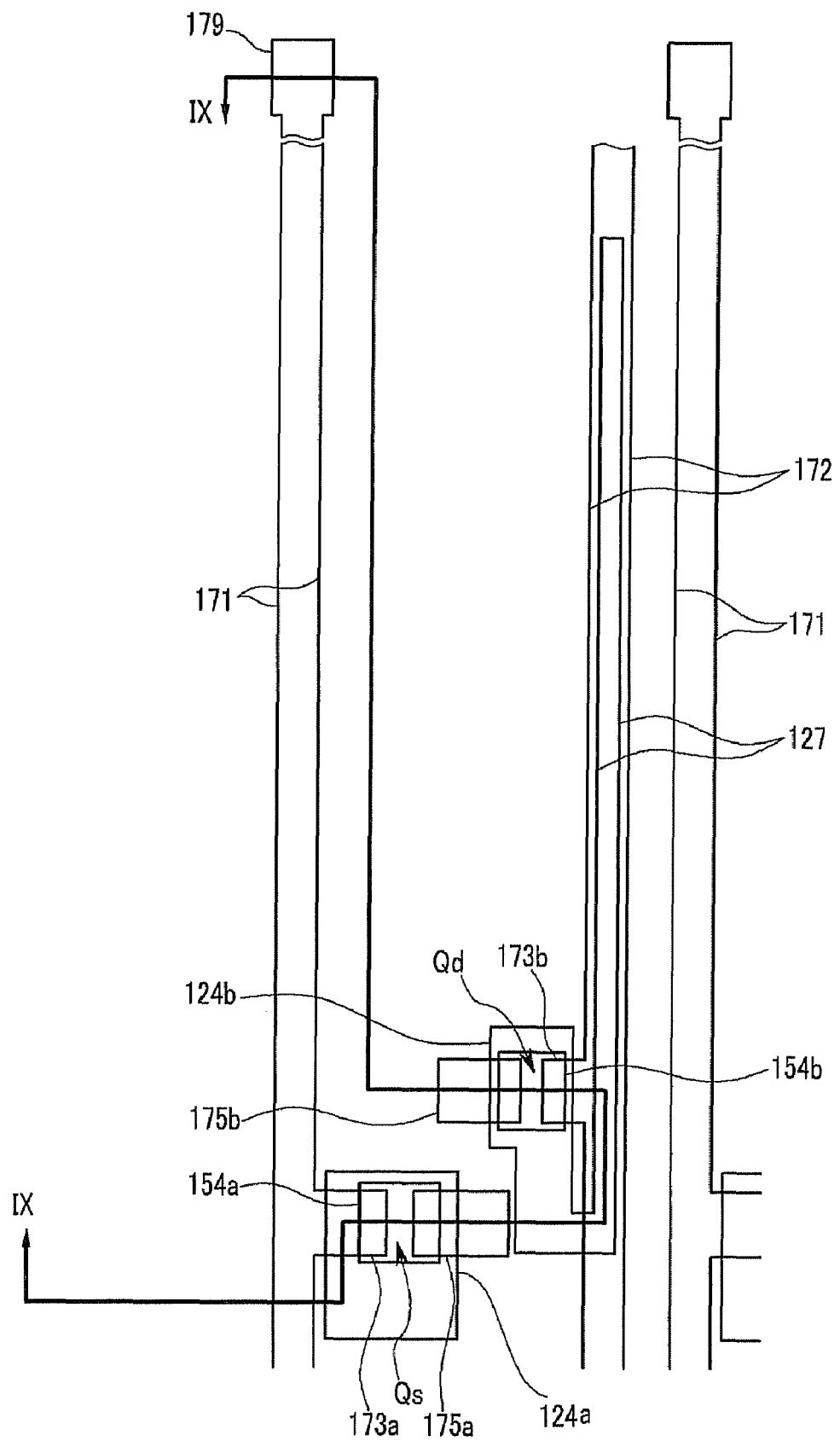

[FIG. 9]
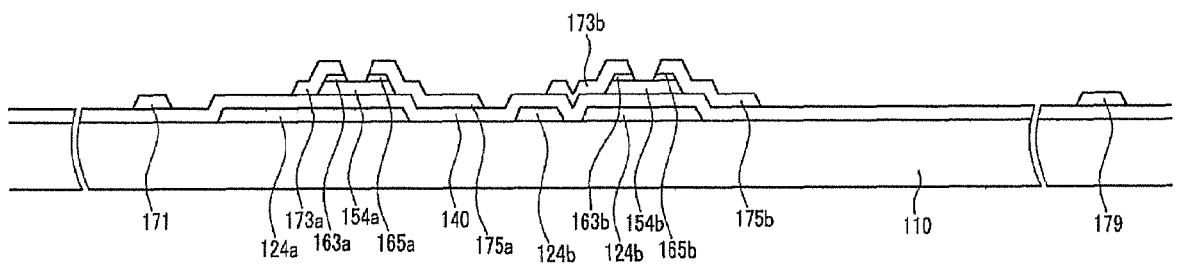

[FIG. 10]
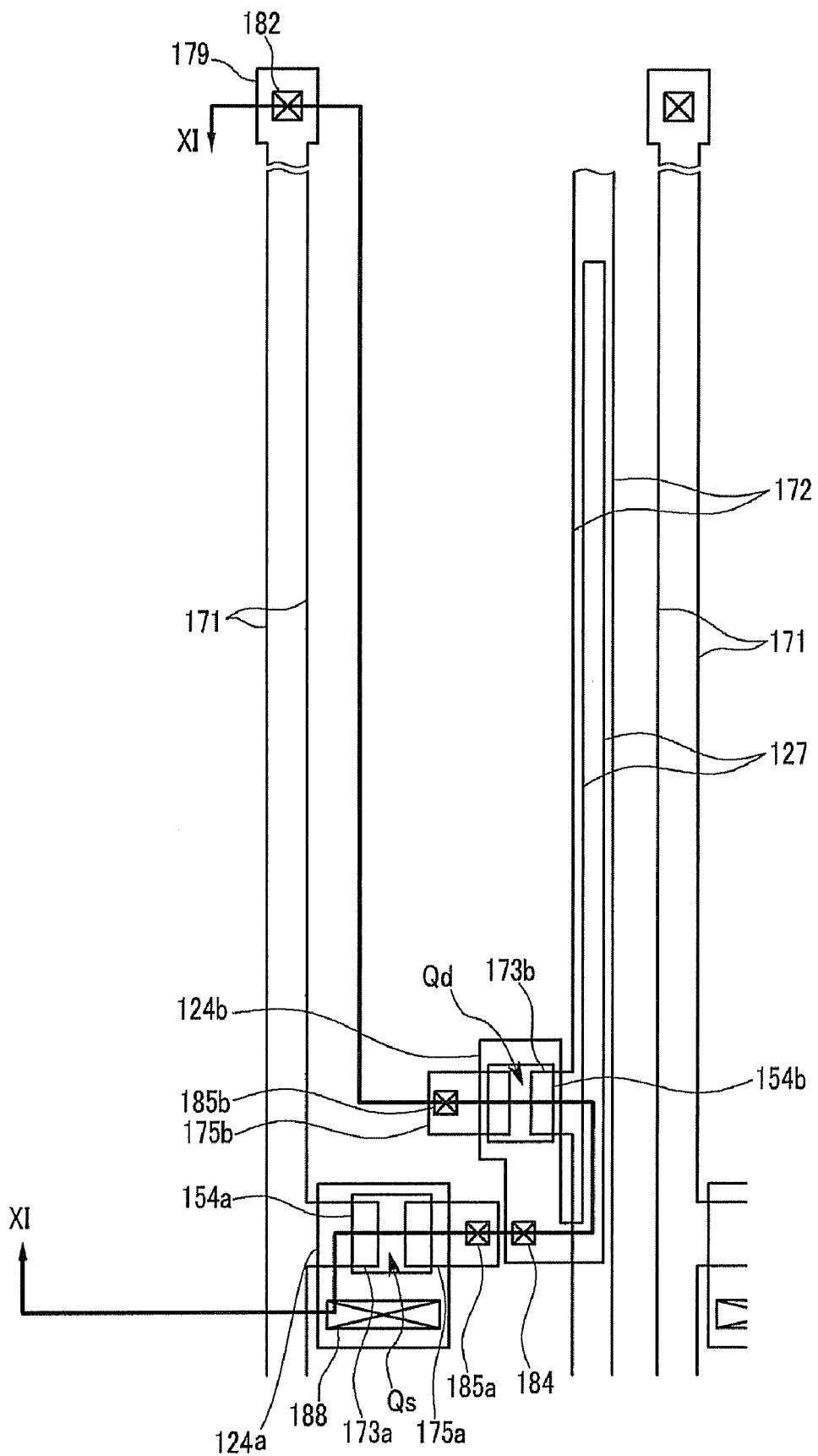

[FIG. 11]
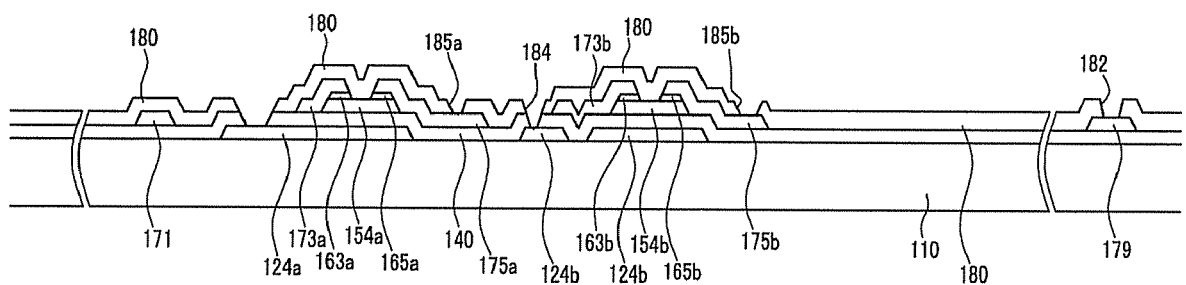

[FIG. 12]
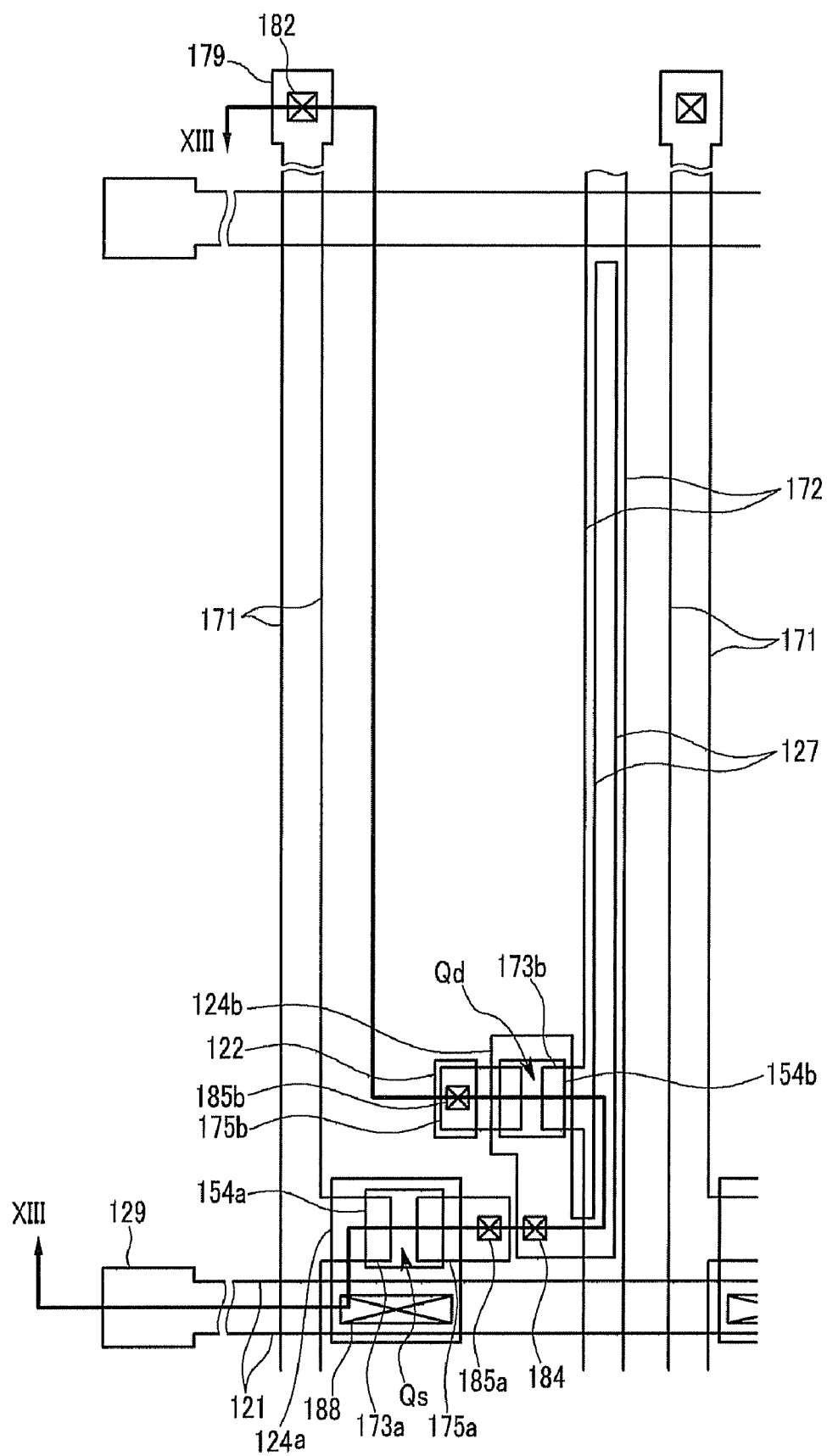

[FIG. 13]
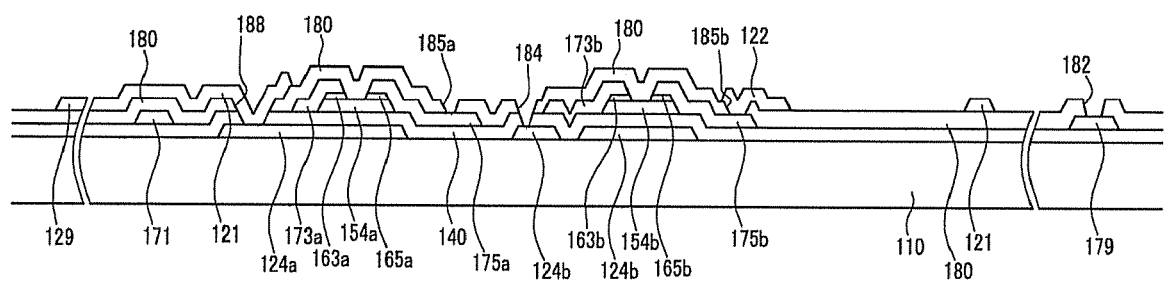

[FIG. 14]
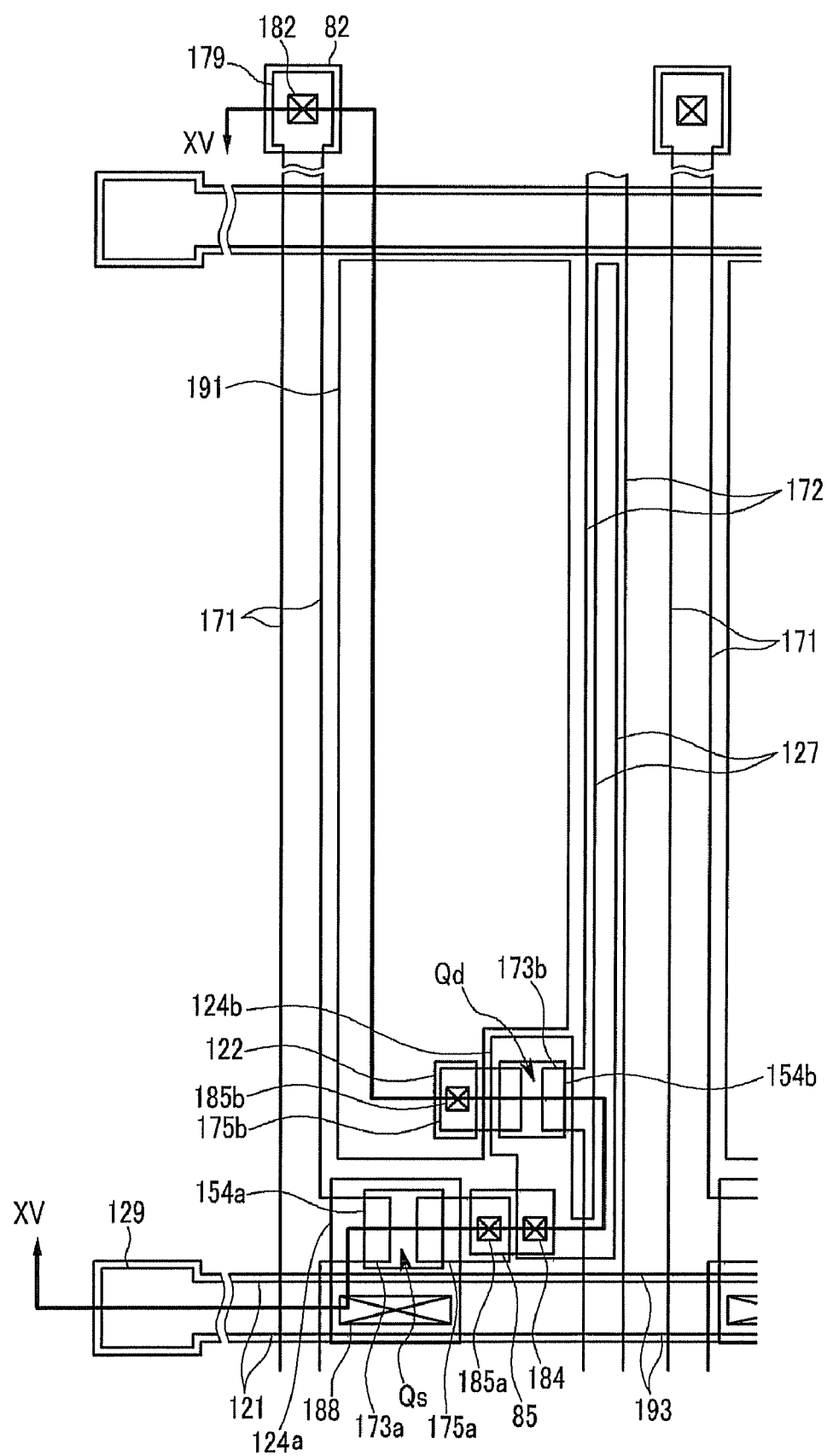

[FIG. 15]
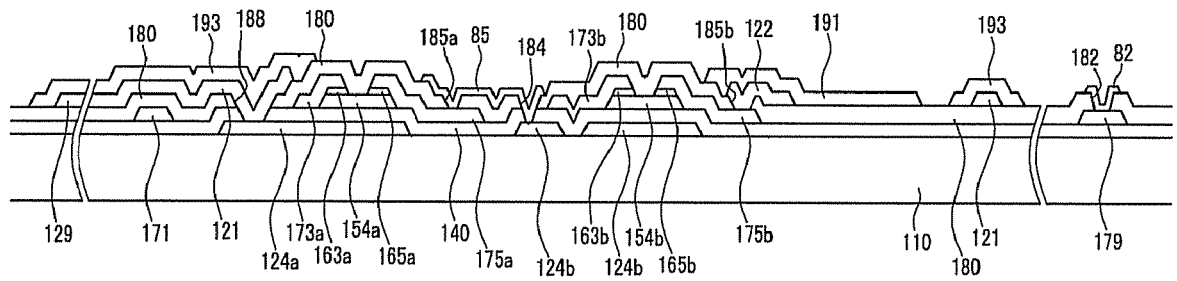

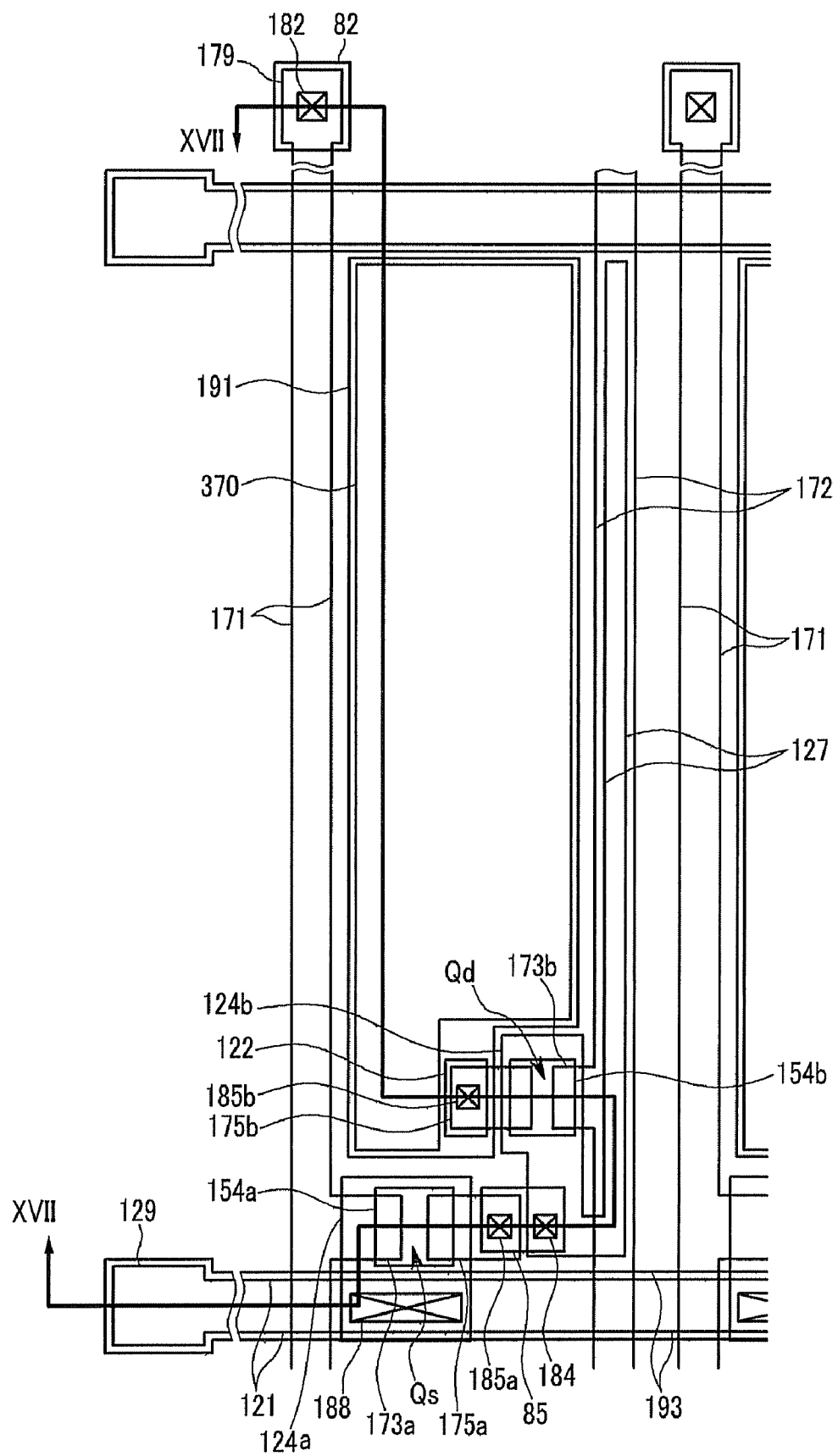
[FIG. 16]

[FIG. 17]
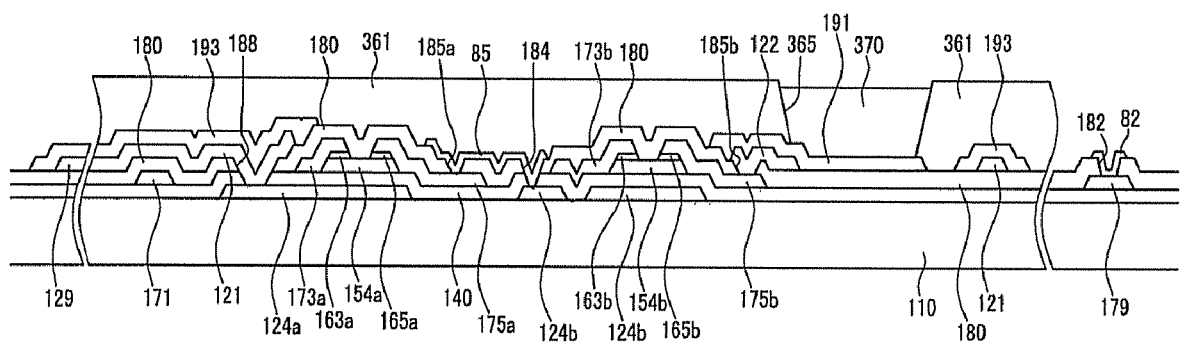

THIN FILM TRANSISTOR ARRAY PANEL

This application claims priority to Korean Patent Application No. 10-2005-0097427, filed on Oct. 17, 2005, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor array panel and a manufacturing method thereof.

(b) Description of the Related Art

A flat panel display, such as a liquid crystal display ("LCD"), an organic light emitting diode ("OLED") display, or an electrophoresis display, for example, includes a plurality of pairs of field generating electrodes and an electro-optically activated layer interposed between the field generating electrodes.

One of the pairs of field generating electrodes is connected to a switching element and is supplied with an electrical signal, and the electro-optically activated layer converts the electrical signal to an optical signal to display images.

The LCD includes a liquid crystal layer as the electro-optically activated layer, and the OLED display includes an organic light emitting layer as the electro-optically activated layer.

A thin film transistor TFT having three terminals may be used in the flat panel display as the switching element, and the flat panel display may include a plurality of gate lines for transmitting scanning signals to control the TFT and a plurality of data lines for transmitting image signals to the pixel electrode.

The TFT includes a thin film made of amorphous silicon or polysilicon. The amorphous silicon may be deposited as a thin film at a low temperature, and thereby a substrate made of glass having a low melting point and a low cost may be used. However, the TFT including an amorphous silicon thin film has low field effect mobility. Therefore, the TFT including a polysilicon thin film is preferably used because the polysilicon thin film has high field effect mobility and a low leakage current and is able to perform a high frequency operation.

The polysilicon thin film is formed by depositing an amorphous silicon thin film and crystallizing the deposited amorphous silicon thin film. Here, the crystallization is performed by heat treatment at a high temperature or by laser beam irradiation, for example.

However, when crystallization is performed using the heat treatment, a gate conductor formed under the amorphous silicon thin film is affected by heat applied to the amorphous silicon thin film. In addition, when crystallization is performed using the laser beam irradiation, uniform crystallization may not be easily obtained due to reflection, for example, by the gate conductor.

Accordingly, a polysilicon TFT has a top gate structure. However the polysilicon TFT having the top gate structure has drawbacks which include difficulty in forming the top gate structure and high production costs of the top gate structure.

BRIEF SUMMARY OF THE INVENTION

A thin film transistor array panel according to an exemplary embodiment of the present invention includes a substrate, a control electrode formed on the substrate, a polysilicon semiconductor formed on the control electrode, a data line, an input electrode at least partially overlapping the polysilicon semiconductor and an output electrode facing the input electrode, an insulating layer covering the data line and the output electrode and having a contact hole, a gate line connected to the control electrode through the contact hole, and a pixel electrode connected to the output electrode.

The control electrode and the gate line may include different materials from each-other.

The control electrode may include a refractory conductor, and the gate line may include a conductor having low resistivity.

The control electrode may include at least one of Cr, Mo, W, Ti, Ta, and alloys including at least one of the foregoing metals.

The gate line may include at least one of Al, Cu, Ag, and alloys including at least one of the foregoing metals.

The thin film transistor array panel may further include a protection member covering the gate line.

The protection member may include the same material as the pixel electrode.

The thin film transistor array panel may further include a subsidiary member disposed between the output electrode and the pixel electrode.

The subsidiary member may include the same material as the gate line.

The thin film transistor array panel may further include ohmic contacts disposed between the polysilicon semiconductor and the input electrode and between the polysilicon semiconductor and the output electrode, respectively.

A manufacturing method of a thin film transistor array panel according to an embodiment of the present invention includes forming a control electrode on a substrate, forming a insulating layer and a semiconductor layer of amorphous silicon on the control electrode gate, crystallizing the semiconductor layer of amorphous silicon to form a semiconductor layer of polysilicon, patterning the semiconductor layer of polysilicon, forming a data line, an input electrode and an output electrode on the semiconductor layer of polysilicon, forming an insulating layer having a contact hole on the data line and output electrode, forming a gate line connected to the control electrode through the contact hole, and forming a pixel electrode connected to the output electrode.

The method may further include forming an ohmic contact layer after the polysilicon semiconductor layer, and the polysilicon semiconductor layer and the ohmic contact layer may be patterned together.

An organic light emitting diode display according to an exemplary embodiment of the present invention includes a substrate, first and second control electrodes formed on the substrate, first and second polysilicon semiconductor layers formed on the first and second control electrodes, respectively, a data pattern including a data line, a first input electrode at least partially overlapping the first polysilicon semiconductor layer, a first output electrode connected to the second control electrode and facing a first input electrode, a driving voltage line, a second input electrode and a second output electrode facing the second input electrode, an insulating layer covering the data pattern and having a contact hole, a gate line connected to the first control electrode through the contact hole, a pixel electrode connected to the second output electrode, a light emission member formed on the pixel electrode, and a common electrode formed on the light emission member.

The first control electrode and the second control electrode may include a refractory conductor.

The gate line may include at least one of Al, Cu, Ag, and alloys including at least one of the foregoing metals.

The organic light emitting diode display may further include a protection member covering the gate line.

The protection member may include the same material as the pixel electrode.

The organic light emitting diode display may further include a subsidiary member disposed between the second output electrode and the pixel electrode.

The subsidiary member may include the same material as the gate line.

The organic light emitting diode display may further include a semiconductor of doped amorphous silicon formed on the first and second polysilicon semiconductor layers.

BRIEF DESCRIPTION OF THE DRAWINGS

FIG. 1 is an equivalent circuit schematic diagram of an exemplary OLED display according to an exemplary embodiment of the present invention;

FIG. 2 is a plan view layout of an exemplary OLED display according to an exemplary embodiment of the present invention;

FIG. 3 is a cross-sectional view of the OLED display shown in FIG. 2 taken along line III-III;

FIG. 4, FIG. 6, FIG. 8, FIG. 10, FIG. 12, FIG. 14, and FIG. 16 are plan view layouts of the OLED display shown in FIG. 2 and FIG. 3 illustrating intermediate processing of an exemplary manufacturing method thereof according to an exemplary embodiment of the present invention;

FIG. 5 is a cross-sectional view of the OLED display shown in FIG. 4 taken along line V-V;

FIG. 7 is a cross-sectional view of the OLED display shown in FIG. 6 taken along line VII-VII;

FIG. 9 is a cross-sectional view of the OLED display shown in FIG. 8 taken along line IX-IX;

FIG. 11 is a cross-sectional view of the OLED display shown in FIG. 10 taken along line XI-XI;

FIG. 13 is a cross-sectional view of the OLED display shown in FIG. 12 taken along line XIII-XIII;

FIG. 15 is a cross-sectional view of the OLED display shown in FIG. 14 taken along line XV-XV; and FIG. 17 is a cross-sectional view of the OLED display shown in FIG. 16 taken along line VII-VII.

DETAILED DESCRIPTION OF THE INVENTION

The present invention will be described more fully hereinafter with reference to the accompanying drawings, in which exemplary embodiments of the present invention are shown. This invention may, however, be embodied in many different forms and should not be construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising" or "includes" and/or "including" when used in this specification specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

First, an OLED display according to an exemplary embodiment of the present invention is described in more detail with reference to FIG. 1. FIG. 1 is an equivalent circuit schematic diagram of an exemplary OLED display according to an exemplary embodiment of the present invention.

Referring to FIG. 1, an exemplary OLED display according to an exemplary embodiment of the present invention includes a plurality of signal lines 121, 171 and 172 and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, while the data lines 171 and the driving voltage lines 172 extend substantially in a column direction and substantially parallel to each other, as illustrated.

Each pixel PX includes a switching transistor Qs, a driving transistor Qd, a storage capacitor Cst and an organic light emitting diode LD.

The switching transistor Qs has a control terminal connected to one of the gate lines 121, an input terminal connected to one of the data lines 171 and an output terminal connected to the driving transistor Qd. The switching transistor Qs transmits the data signals that are applied to the data line 171 to the driving transistor Qd in response to the gate signal applied to the gate line 121.

The driving transistor Qd has a control terminal connected to the output terminal of the switching transistor Qs, an input terminal connected to the driving signal line 172, and an output terminal connected to the OLED LD. The driving transistor Qd drives an output current ILD having a magnitude depending on a voltage between the control terminal and the output terminal thereof.

The capacitor Cst is connected between the control terminal and the output terminal of the driving transistor Qd. The capacitor Cst stores the data signal applied to the input terminal of the driving transistor Qd and maintains the data signal after the switching transistor Qd turns off.

The OLED LD has an anode connected to the output terminal of the driving transistor Qd and a cathode connected to a common voltage Vss. The OLED LD emits light having an intensity depending on an output current ILD Of the driving transistor Qd, thereby displaying images.

The switching transistor Qs and the driving transistor Qd are n-channel field effect transistors ("FETs"). However, at least one of the switching transistor Qs and the driving transistor Qd may be a p-channel FET. In addition, the connections among the transistors Qs and Qd, the capacitor Cst and the OLED LD may be modified.

Referring to FIGS. 2 and 3 along with FIG. 1, a detailed structure of the OLED display shown in FIG. 1 according to an exemplary embodiment of the present invention will be described in more detail.

FIG. 2 is a plan view layout of an exemplary OLED display according to an exemplary embodiment of the present invention. FIG. 3 is a cross-sectional view of the OLED display shown in FIG. 2 taken along line III-III.

A plurality of gate conductors, which include a first control electrode 124a and a plurality of second control electrodes 124b, are formed on an insulating substrate 110 made of a material such as transparent glass or plastic.

The first control electrode 124a has an island shape, and the second control electrode 124b includes a storage electrode 127 extending downward from the second control electrode 124b, turning to the right, and extending upward relative to the illustration of FIG. 2.

In exemplary embodiments, the gate conductors 124a and 124b are made of a refractory conductor such as Cr, Mo, W, Ti, Ta, or alloys comprising at least one of the foregoing metals. The gate conductors 124a and 124b may have a multilayered structure including two films having different physical characteristics.

The lateral sides of the gate conductors 124a and 124b are inclined relative to a surface of the substrate 110, and the inclination angle thereof ranges from about 30 degrees to about 80 degrees.

In exemplary embodiments, a gate insulating layer 140 made of silicon nitride ("SiNx") or silicon oxide ("SiOx") is formed on the gate conductors 124a and 124b. A plurality of first and second semiconductor islands 154a and 154b preferably made of polysilicon are formed on the gate insulating layer 140. The first and second semiconductor islands 154a and 154b are disposed on the first and second control electrodes 124a and 124b, respectively.

A plurality of pairs of first ohmic contact islands 163a and 165a and a plurality of pairs of second ohmic contact islands 163b and 165b are formed on the first and second semiconductor islands 154a and 154b, respectively. The ohmic contacts 163a, 163b, 165a and 165b are preferably made of silicide or n+ hydrogenated a-Si heavily doped with an n-type impurity, such as phosphorous, for example.

A plurality of data conductors, which include a plurality of data lines 171, a plurality of driving voltage lines 172, and a plurality of first and second output electrodes 175a and 175b, are formed on the ohmic contacts 163a, 163b, 165b and 165b, and the gate insulating layer 140.

The data lines 171 for transmitting data signals extend substantially in the longitudinal direction and intersect the gate lines 121, as illustrated in FIG. 2. Each data line 171 includes a plurality of first input electrodes 173a extending toward the first control electrodes 124a and an end portion 179 having a large area for contact with another layer or an external driving circuit (not shown). The data lines 171 may extend to be directly connected to a data driving circuit (not shown) for generating the data signals, which may be integrated with the substrate 110.

The driving voltage lines 172 for transmitting driving voltages extend substantially in the longitudinal direction and intersect the gate lines 121. Each driving voltage line 172 includes a plurality of second input electrodes 173b extending therefrom toward the second control electrodes 124b. The driving voltage lines 172 overlap the storage electrodes 127, as illustrated in FIG. 1.

The first and second output electrodes 175a and 175b are separated from each other and from the data lines 171 and the driving voltage lines 172. Each pair of the first input electrodes 173a and the first output electrodes 175a are disposed opposite each other with respect to a first control electrode 124a, and each pair of the second input electrodes 173b and the second output electrodes 175b are disposed opposite each other with respect to a second control electrode 124b.

In exemplary embodiments, the data conductors 171, 172, 175a and 175b are made of a refractory conductor such as Mo, Cr, Ta, Ti, or alloys comprising at least one of the foregoing metals. The data conductors 171, 172, 175a and 175b may have a multilayered structure including a refractory metal film and a low resistivity film.

Like the gate conductors 124a and 124b, the data conductors 171, 172, 175a and 175b have inclined edge profiles, and the inclination angles thereof ranges from about 30 degrees to about 80 degrees.

A passivation layer 180 is formed on the data conductors 171, 172, 175a and 175b, the exposed portions of the semiconductors 154a and 154b, and the gate insulating layer 140. The passivation layer 180 is made of an inorganic or organic insulator. Examples of the inorganic insulator include silicon nitride and silicon oxide, while examples of the organic insulator include a polyacrylic compound, but is not limited to the foregoing. The passivation layer 180 may have a double-layered structure including a lower film of an inorganic insulator and an upper film of an organic insulator.

The passivation layer 180 has a plurality of contact holes 182, 185a and 185b exposing the end portions 179 of the data lines 171, the first output electrodes 175a, and the second output electrodes 175b, respectively. The passivation layer 180 and the gate insulating layer 140 have a plurality of contact holes 188 and 184 exposing the first control electrodes 124a and the second control electrode 124b, respectively. A plurality of gate lines 121 and a plurality of subsidiary members 122 are formed on the passivation layer 180.

The gate lines 121 for transmitting gate signals extend substantially in a transverse direction. Each gate line 121 is connected to the first control electrode 124a through the contact hole 188 to transmit the gate signal to the first control electrode 124a. The gate line 121 includes an end portion 129 having a large area for contact with another layer or an external driving circuit (not shown). The gate lines 121 may extend to be directly connected to a gate driving circuit (not shown) for generating the gate signals, which may be integrated with the substrate 110.

Each subsidiary member 122 is separated from the gate line 121, and is connected to the second output electrode 175b through the contact hole 185b.

The gate line 121 and subsidiary member 122 are preferably made of an Al-containing metal such as Al and an Al alloy, an Ag-containing metal such as Ag and an Ag alloy, and a Cu-containing metal such as Cu and a Cu alloy.

As described above, the control electrode 124a and 124b of the TFT and the gate line 121 for transmitting gate signals are disposed under and above the semiconductors 154a and 154b made of polysilicon, respectively, and they are connected to each other through the contact hole 188. The control electrodes 124a and 124b and the gate lines 121 are made of different materials, e.g., the control electrodes 124a and 124b are made of a conductor having a high melting point to endure a high temperature process for crystallization of amorphous silicon, and the gate lines 121 are made of a conductor having low resistivity for decreasing a signal delay or distortion. Accordingly, an exemplary OLED display according to an exemplary embodiment of the present invention may have a bottom gate structure of a TFT including polysilicon having high electric field effect mobility and a signal line for decreasing a signal delay or signal distortion, and a manufacturing method thereof becomes simple.

A plurality of pixel electrodes 191, a plurality of protection members 193, a plurality of connecting members 85, and a plurality of contact assistants 82 are formed on the gate lines 121, the subsidiary members 122, and the passivation layer 180. They may be made of a transparent conductor such as indium tin oxide ("ITO") or indium zinc oxide ("IZO"), or they may be made of an opaque conductor including Al or an alloy thereof, or Au, Pt, Ni, Cu, or W having a high work function or an alloy thereof in a top emission type of OLED display.

The pixel electrodes 191 are physically and electrically connected to the second output electrodes 175b through the subsidiary members 122. The subsidiary members 122 may complement the adhesion between the pixel electrodes 191 and the second output electrodes 175b. The subsidiary members 122 may also prevent an etchant used in patterning of the pixel electrodes 191 from inflowing to the lower conductor such as the second output electrodes 175b.

The protection member 193 covers and protects the gate lines 121. The protection member 193 is formed on the gate lines 121 to prevent the gate lines 121, which are made of a conductor having low chemical resistance such as an Al-containing metal, from being damaged by an etchant during a subsequent process.

The connecting member 85 is connected to the second control electrode 124b and the first output electrode 175a through the contact holes 184 and 185a.

The contact assistant 82 is connected to the end portion 179 of the data line 171 through the contact hole 182 (FIG. 2). The contact assistant 82 complements the adhesion between the end portion 179 of the data line 171 and an external device (not shown), and protects the end portion 179 of the data line 171.

A partition 361 is formed on the passivation layer 180. The partition 361 surrounds the pixel electrodes 191 like a bank to define openings 365. The partition 361 may be made of organic insulators such as acrylic resin and polyimide resin, having heat-resistant and dissolvent properties, or be made of inorganic insulators such as silicon oxide ("$SiO_2$") and titanium oxide ("$TiO_2$"), and the partition 361 may have a multilayered structure. The partition 361 may be made of a photosensitive material containing a black pigment so that the black partition 361 may serve as a light blocking member and the formation of the partition 361 may be simplified.

A plurality of light emitting members 370 are formed on the pixel electrodes 191 and are confined in the openings 365 defined by the partition 361. Each of the light emitting members 370 may have a multilayered structure including an emitting layer (not shown) for emitting light, and auxiliary layers (not shown) for improving the efficiency of light emission of the emitting layer.

In exemplary embodiments, each of the light emitting members 370 is made of an organic material, which uniquely emits light of one of the primary colors, such as red, green and blue, or a mixture of an organic material and an inorganic material, and may include a high molecular substance such as a polyfluorene derivative, a (poly)paraphenylenevinylene derivative, a polyphenylene derivative, a polyfluorene derivative, polyvinylcarbazole, a polythiophene derivative, or a compound doping the above high molecular substance with a perylene group pigment, a cumarine group pigment, a rhodamine group pigment, rubrene, perylene, 9,10-diphenylanthracene, tetraphenylbutadiene, Nile red, coumarin, quinacridone, or a combination comprising at least one of the foregoing derivatives. The OLED display displays images by spatially adding the monochromatic primary color light emitted from each of the light emitting members 370.

The auxiliary layers (not shown) may include an electron transport layer (not shown) and a hole transport layer (not shown) for improving the balance of electrons and holes, and an electron injecting layer (not shown) and a hole injecting layer (not shown) for improving the injection of the electrons and holes. The hole transport layer and the hole injecting layer may be made of a material having a work function which lies between that of the pixel electrodes 191 and that of the emission layer. The electron transport layer and the electron injecting layer may be made of a material having a work function which lies between that of a common electrode 270 and that of the emission layer. For example, the hole transport layer and the hole injecting layer may be made of a compound such as poly-(3,4-ethylenedioxythiophene): polystyrene sulfonate ("PEDOT:PSS").

The common electrode 270 is formed on the light emitting members 370. The common electrode 270 is formed on the entire substrate 110, and supplies currents to the light emitting members 370 in cooperation with the pixel electrodes 191.

In exemplary embodiments, the common electrode 270 is made of opaque conductive materials, which have a good electron injection property and no influence on the organic material, such as an Al-containing metal or Ba. Otherwise, the common electrode 270 may be made of transparent or translucent (semi-transparent) conductive materials in the top emission OLED display. For example, the common electrode 270 may include ITO and IZO, and may have a single-layered structure having a thickness of about 50 Å to about 100 Å and including a small amount of Al or Ag, or a multilayered structure, such as Ca—Ag, LiF—Al, Ca—Ba, and Ca—Ag—ITO, for example.

In the above-described OLED display, a first control electrode 124a connected to a gate line 121, a first input electrode 173a connected to a data line 171, and a first output electrode 175a along with a first semiconductor island 154a form a switching TFT Qs having a channel formed in the first semiconductor island 154a disposed between the first input electrode 173a and the first output electrode 175a. Likewise, a second control electrode 124b connected to the first output electrode 175a, a second input electrode 173b connected to a driving voltage line 172, and the second output electrode 175b connected to a pixel electrode 191 along with a second semiconductor island 154b form a driving TFT Qd having a channel formed in the second semiconductor island 154b disposed between the second input electrode 173b and the second output electrode 175b.

Although the OLED display according to this exemplary embodiment includes a plurality of pixels having one switching TFT Qs and one driving TFT Qd, other TFTs and wiring for driving the plurality of pixels may be included to prevent the driving TFT Qd from degrading and the lifetime of the OLED display from being shortened.

A pixel electrode 191, a light emitting member 370 and the common electrode 270 form an OLED LD having the pixel electrode 191 as an anode and the common electrode 270 as a cathode, or vice versa. The overlapping portions of the storage electrode 127 and the driving voltage line 172 form a storage capacitor Cst.

Now, a method of manufacturing the OLED display shown in FIG. 2 and FIG. 3 according to an exemplary embodiment of the present invention is described with reference to FIGS. 4 through 17 along with FIGS. 2 and 3.

FIGS. 4, 6, 8, 10, 12, 14 and 16 are plan view layouts of the OLED display shown in FIGS. 2 and 3 illustrating intermediate processing of an exemplary manufacturing method thereof according to an exemplary embodiment of the present invention. FIG. 5 is a cross-sectional view of the OLED display shown in FIG. 4 taken along line V-V; FIG. 7 is a cross-sectional view of the OLED display shown in FIG. 6 taken along line VII-VII; FIG. 9 is a cross-sectional view of the OLED display shown in FIG. 8 taken along line IX-IX; FIG. 11 is a cross-sectional view of the OLED display shown in FIG. 10 taken along line XI-XI; FIG. 13 is a cross-sectional view of the OLED display shown in FIG. 12 taken along line XIII-XIII; FIG. 15 is a cross-sectional view of the OLED display shown in FIG. 14 taken along line XV-XV; and FIG. 17 is a cross-sectional view of the OLED display shown in FIG. 16 taken along line VII-VII.

As shown in FIGS. 4 and 5, a gate conductor made of Cr in exemplary embodiments, which includes a plurality of first control electrodes 124a and a plurality of second control electrodes 124b including storage electrodes 127, is formed on the substrate 110.

Next, a gate insulating layer 140 and an intrinsic amorphous silicon layer are sequentially deposited by plasma enhanced chemical vapor deposition ("PECVD"), for example.

The intrinsic amorphous silicon layer is crystallized to form a polysilicon layer. Here, the crystallization is performed by rapid thermal annealing ("RTA") at a temperature of about 500° C. to about 800° C. for several tens of seconds. Otherwise, crystallization using a low temperature laser or a metal catalyst, for example, may be used.

Next, an extrinsic amorphous silicon layer is deposited on the polysilicon layer. Referring to FIGS. 6 and 7, the extrinsic amorphous silicon layer and the polysilicon layer are patterned by photolithography and etching to form a plurality of first and second extrinsic semiconductors 164a and 164b and a plurality of first and second semiconductor islands 154a and 154b, respectively.

Referring to FIGS. 8 and 9, data conductors made of an Al alloy in exemplary embodiments, which include a plurality of data lines 171 including first input electrodes 173a and end portions 179, a plurality of driving voltage lines 172 including second input electrodes 173b, and a plurality of first and second output electrodes 175a and 175b, are formed.

Thereafter, portions of the extrinsic semiconductors 164a and 164b, which are not covered with the data conductors 171, 172, 175a and 175b, are removed by etching to complete a plurality of ohmic contacts 163a, 165a, 163b and 165b to expose portions of the underlying first and second semiconductors 154a and 154b.

Referring to FIGS. 10 and 11, a passivation layer 180 is deposited by chemical vapor deposition ("CVD"), for example. Thereafter the passivation layer 180 and the gate insulating layer 140 are patterned by photolithography and etching to form a plurality of contact holes 182, 184, 185a, 185b and 188 exposing the end portions 179 of the data lines 171, the second control electrode 124b, the first output electrode 175b, the second output electrode 175b, and the first control electrode 124a, respectively.

Thereafter, a plurality of gate lines 121 including end portions 129, and subsidiary members 122 made of an Al alloy in exemplary embodiments, are formed on the passivation layer 180 as shown in FIG. 12 and FIG. 13.

Thereafter, a plurality of pixel electrodes 191, a plurality of protection members 193, a plurality of connecting members 85, and a plurality of contact assistants 82 are formed as shown in FIGS. 14 and 15.

Referring to FIGS. 16 and 17, a photosensitive organic insulator is coated by spin coating, exposed to light and developed to form a partition 361 having an opening 365 on the pixel electrode 191.

Thereafter, light emitting members 370 including a hole transport layer (not shown) and an emission layer (not shown) are formed in the openings 365 disposed on the pixel electrodes 191, as shown in FIGS. 2 and 13. The light emitting members 370 are formed by a solution process in exemplary embodiments, such as by inkjet printing, which drips a solution into the openings 365 by moving an inkjet head (not shown), and in this case, a drying step for removing the solvent follows.

Next, a common electrode 270 is formed on the partitions 361 and light emitting members 370.

As described above, an exemplary OLED display according to an exemplary embodiment of the present invention may include a TFT having a bottom gate structure including a polysilicon semiconductor, and thereby the manufacturing method may be simplified and the production cost may decrease.

Accordingly, the OLED display may have a high electric field effect and may decrease a signal delay or signal distortion.

The above-described exemplary embodiments can be also applied to other TFT panels for display devices, such as a liquid crystal display device, an electrophoresis display device, etc.

While the present invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. A thin film transistor array panel comprising:
   a substrate;
   a control electrode formed on the substrate;
   a polysilicon semiconductor formed on the control electrode;
   a data line, an input electrode at least partially overlapping the polysilicon semiconductor and connected to the data line, and an output electrode facing the input electrode;
   an insulating layer covering the data line and the output electrode and having a contact hole;
   a gate line connected to the control electrode through the contact hole; and
   a pixel electrode connected to the output electrode.

2. The thin film transistor array panel of claim 1, wherein the control electrode and the gate line comprise different materials.

3. The thin film transistor array panel of claim 2, wherein the control electrode comprises a refractory conductor, and the gate line comprises a conductor having low resistivity.

4. The thin film transistor array panel of claim 3, wherein the control electrode comprises at least one of Cr, Mo, W, Ti, Ta, and alloys comprising at least one of the foregoing metals.

5. The thin film transistor array panel of claim 3, wherein the gate line comprises at least one of Al, Cu, Ag, and alloys comprising at least one of the foregoing metals.

6. The thin film transistor array panel of claim 1, further comprising a protection member covering the gate line.

7. The thin film transistor array panel of claim 6, wherein the protection member comprises the same material as the pixel electrode.

8. The thin film transistor array panel of claim 1, further comprising a subsidiary member disposed between the output electrode and the pixel electrode.

9. The thin film transistor array panel of claim 8, wherein the subsidiary member comprises the same material as the gate line.

10. The thin film transistor array panel of claim 1, further comprising ohmic contacts disposed between the polysilicon semiconductor and the input electrode and between the polysilicon semiconductor and the output electrode, respectively.

* * * * *